United States Patent [19]

Dietsch et al.

[11] Patent Number: 4,899,208

[45] Date of Patent: Feb. 6, 1990

[54] POWER DISTRIBUTION FOR FULL WAFER PACKAGE

[75] Inventors: Hans E. Dietsch, Essex; William J. Nestork, Hinesburg, both of Vt.

[73] Assignee: International Business Machines Corporation, Armonk, N.Y.

[21] Appl. No.: 134,480

[22] Filed: Dec. 17, 1987

[51] Int. Cl.[4] .............................................. H01L 23/02
[52] U.S. Cl. ........................................ 357/74; 357/79; 357/80; 357/81
[58] Field of Search .................... 357/74, 80, 81, 79

[56] References Cited

U.S. PATENT DOCUMENTS

| | | | |
|---|---|---|---|
| 3,999,105 | 12/1976 | Archey et al. | 174/16 HS |
| 4,000,509 | 12/1976 | Jarvela | 357/81 |
| 4,595,945 | 6/1986 | Graver | 357/80 |
| 4,672,421 | 6/1987 | Lin | 357/80 |

FOREIGN PATENT DOCUMENTS

| | | |
|---|---|---|
| 0098932 | 6/1983 | European Pat. Off. . |
| 0136888 | 9/1983 | European Pat. Off. . |
| 0177656 | 9/1985 | Japan .................... 357/74 |
| 0005649 | 1/1987 | Japan .................... 357/74 |
| 7900302 | 5/1979 | World Int. Prop. O. ........ 357/81 C |

Primary Examiner—Frank Gonzalez
Attorney, Agent, or Firm—William N. Hogg; T. Rao Coca; Theodore E. Galanthay

[57] ABSTRACT

A full wafer packing technique for semiconductor devices is provided. The semiconductor wafer is mounted on a substrate wherein the coefficient of thermal expansion of the substrate is matched to that of the wafer. The wafer is also provided with at least one bus member extending across the surface of the wafer to provide voltage power to the devices. Further, the packaging includes a cover, and a solid dielectric thermally conducting material which is disposed between and the wafer and substrate and fills the space between the cover and wafer and substrate.

13 Claims, 6 Drawing Sheets

POWER DISTRIBUTION FOR FULL WAFER PACKAGE

BACKGROUND OF THE INVENTION

1. Field of the Invention

This invention relates generally to the packaging of semiconductor devices for use in computers, and more particularly to packaging of full wafers of silicon having integrated circuit devices formed thereon.

2. Description of the Prior Art

In the semiconductor art, large numbers of integrated circuit devices defining complex integrated circuits are formed on semiconductor materials, such as silicon wafers, by techniques which are well known in the art; and, as technology advances, larger wafers can be used in the manufacturing process with attendant cost savings. Typically the wafers are cut or otherwise diced to form a large number of individual integrated circuit chips. These chips are then mounted individually, or in groups, on suitable substrates, such as metalized ceramic material. Several such substrates having chips mounted are then typically mounted on cards or boards to form the electronic circuitry of a computer or other product.

In order to improve the efficiency and effectiveness of packaging integrated circuits, there have been prior art proposals to package an entire wafer as a whole, rather than dicing the wafer into individual chips thereby achieving increased efficiency in packaging density, as well as eliminating the need for the dicing and associated processes. One such proposal is shown and described in U.S. Pat. No. 3,999,105, assigned to the assignee of this invention. In the 3,999,105 patent, a packaging technique is described wherein a full wafer is mounted on a wafer carrier. Pins are provided around the periphery of the carrier to bring power to the wafer, and carriers with wafers thereon are mounted within a housing. The carrier and thus the wafers are electrically connected by pin interconnections, and the housing is sealed and filled with a liquid coolant, the cooling being accomplished by nucleate boiling.

While this type of packaging has some advantages, it has several drawbacks which have prevented it from achieving wide acceptance. One of the principal drawbacks with this full wafer packaging technique is the problem associated with providing adequate electrical power in a timely manner to efficiently and reliably perform the electrical operations. This is in large measure due to the fact that the electrical power has been supplied from around the periphery of the wafer, and by supplying the power at the periphery, a significant voltage drop occurred from the outer edge to devices in the center, since by virtue of its structure the metal lines carrying the power are of limited size. Also the distance and voltage requirements result in quite slow operation of device drivers, which can have very short signal rise times in modern CMOS technology.

Another drawback to this particular technique is the liquid cooling technique, which is not completely reliable and rather inefficient.

Still a further drawback to full wafer mounting technology is the very great sensitivity of the structure to thermal mismatch of the wafer and the supporting substrate, which if present even in a relatively small degree can result in cracking with attendant device and circuit malfunction.

SUMMARY OF THE INVENTION

According to the present invention, an improved full wafer package is provided which has improved power delivery and distribution characteristics as well as improved thermal cooling and a good thermal match between the wafer and the substrate. The package includes a substrate which mounts a semiconductor wafer on at least one side thereof. The wafer and substrate are thermally matched for coefficient of expansion. The wafer has integrated circuit devices formed thereon and current carrying lines on the surface of the wafer interconnect the devices to each other to form integrated circuits. Electrical conducting buses are provided comprised of electrically conducting strips which extend transversally across the surface of the wafer and are connected to appropriate current carrying lines on the wafer surface. The strips are connected to desired voltage levels to thus provide the correct voltage level directly on the surface of the wafer and thereby provide improved voltage and signal response characteristics to the circuit components. The invention also contemplates packing the wafer-substrate device inside a heat sink cover member and packing a solid conformable thermally conducting material between the cover and wafer, and providing adjustable fastening means to secure the substrate and wafer to the cover and allow adjustment of the cover with respect to the wafer for the purpose of improving contact of the cover and wafer with the thermally conducting solid material.

DESCRIPTION OF THE PREFERRED EMBODIMENTS

Referring now to the drawings, and for the present to FIGS. 1, 4, 5, and 6, one embodiment of a full wafer package according to this invention is shown. A substrate 10 is provided, which mounts silicon wafers 12 on both sides thereof, the wafers preferably being secured to the substrate by solder connections 14. The wafers 12 have various semiconductor devices formed on their surfaces and extending down therein and interconnected by lines of conducting material 15 to form integrated circuits. Such wafers having these integrated circuits are well known in the art, e.g. see U.S. Pat. No. 3,999,105. The substrate material is preferably made of copper clad Invar, and either lead-tin or lead-indium solder is preferred. One of the important aspects of this invention is the requirement for the thermal coefficients of expansion of the substrate and the silicon wafer be matched since if there is any significant mismatch, cracking and other failure of wafers can occur. Further, the matching does not constitute selecting the substrate to have the same coefficient of thermal expansion as the wafer for the following reasons. The operating semiconductor devices are located at or near the top of the silicon wafer, and hence when operating, generate power which causes a temperature rise at the top surface of the silicon wafer. The heat transfer through the wafer 12 and the solder 14 to the substrate 10 involves the loss of heat and thus the surface of the substrate 10 will be at a lower temperature than the surface of the silicon wafer 12. For example, the surface of the silicon wafer may be at a temperature of 85° C. during operation of the device, whereas the surface of the substrate may be at about 75° C. Thus there would be a significantly different amount of actual expansion between the silicon wafer and the substrate from ambient to operating temperature if they were to have the same coefficients of thermal expansion. To compensate for this, the substrate must have a proportionately higher coefficient of expansion than that of the silicon wafer. The difference in coefficient of expansion of the wafer and the sustrate should be in the ratio of the temperature rise of the wafer to the temperature rise of the substrate from ambient (i.e. normal non-operating temperature of the wafer and substrate) to the average operating temperature of the wafer. In this example, assuming ambient to be 20° C. the ratio of coefficient of thermal expansion of the substrate to the coefficient of thermal expansion of the wafer would be 85-20/75-20 or 65/55 or 1.18. Thus if the silicon wafer were to have a coefficient of thermal expansion of 3.0 ppm/° C., the substrate should have a coefficient of expansion of about 3.54 ppm/° C. (3.0×1.18). Expressed in more general terms, the formula for matching the thermal coefficients of expansion is:

$$TCE_{sub} = \frac{T_{waf} - T_{AMB}}{T_{sub} - T_{AMB}} \times TCE_{waf}$$

wherein $TCE_{sub}$=coefficient of thermal expansion of the substrate material $TCE_{waf}$=coefficient of thermal expansion of wafer material $T_{waf}$=average operating surface temperature of wafer $T_{sub}$=average operating surface temperature of substrates $T_{AMB}$=ambient temperature It is well known in the art that the TCE of silicon wafer varies with different dopants and other factors, which are known, and the TCE of the wafer can be easily and routinely determined. This can be done by constructing an operating model, or can be calculated based on known thermal resistance of the wafer and the thickness of wafer. It is also well known in the art that the TCE of copper clad Invar can be varied by varying the thickness of the copper coating. Thus routine calculation and/or temperature measurements will provide the necessary values to select the proper substrate for the required thermal substrate.

The devices on the silicon substrate are connected to pads 16 located around the periphery thereof, which pads 16 are connected to corresponding connectors 18 arranged around the periphery of the substrate 10 by means of wire leads 20. These connections are preferably formed by laser welding of the wire leads to both the pads 16 and connectors 18, and can be done by using a decal technique, wherein the wires are supported in a predetermined array and then laser welded.

Figure 4:
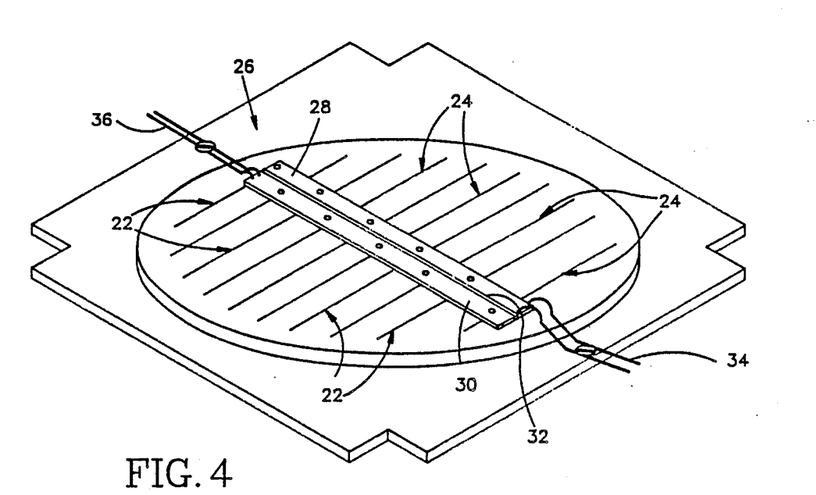
FIG. 4 is a perspective view, somewhat diagrammatic of the wafer and power supply of the embodiment of FIG. 1.

As can best be seen in FIG. 4, in addition to the conductor devices and interconnecting lines 15, and signal pads 16, the wafers are provided with two sets of power voltage lines 22 and 24, the lines 22 being adapted to bring desired operating voltage levels to the devices, and the lines 24 being designed to provide a ground voltage to the devices. Alternatively, ground voltage may be applied by utilizing the substrate material, and the lines 22 and 24 can be used for different voltage levels. An electrically conducting bus 26 extends transversely across the wafer and is comprised of a voltage section 8 and a ground section 30 joined by a dielectric material 32. In this embodiment the bus face is configured to have contact with lines 22 and 24 on the wafer 12, and the voltage section 28 is connected to the voltage lines 22 by solder connection and the ground section 30 is connected to the ground lines 24 also by solder connections. There are several significant advantages to bringing voltage and ground levels to the wafer in this way as opposed to edge connection of the voltage lines as used for the signals and in the prior art. First, it is necessary to have a conductor of substantial cross sectional area to avoid harmful voltage drop, which can adversely affect the operation of the devices; and it is not practical to provide such large cross-sectional conduction with the surface metallurgy on the wafer to minimize voltage drop. However, with this voltage bus arrangement, the necessary conductor size can be easily achieved, and voltage supplied at all points across the wafer without being tied to the necessity of bringing in voltage on small size metallurgy conductors from the edge. If the wafer and devices are of such a size and configuration that voltage must be brought closer to other portions of the wafer, a plurality of additional buses parallel to the bus 26 can be used, as electrical requirements dictate, with the sections of the busses being connected to appropriate voltage and ground conductors on the wafer surface. A second advantage of this arrangement is that the voltage source is brought closer to the devices, and this can be significant in CMOS technology which requires rapid response time for device drivers, this being achieved by the closer proximity of the voltage source.

The voltage section 28 has a lead 34 connected to a voltage source, and the ground section 30 has a lead 36 connected to ground.

Figure 9:
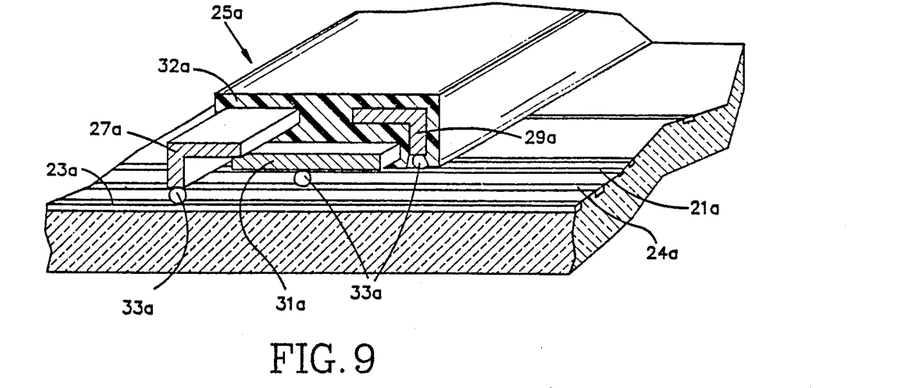
FIG. 9 is a perspective view partially in section showing another embodiment of the invention utilizing a three part single bus in the face mounted configuration.
Figure 10:
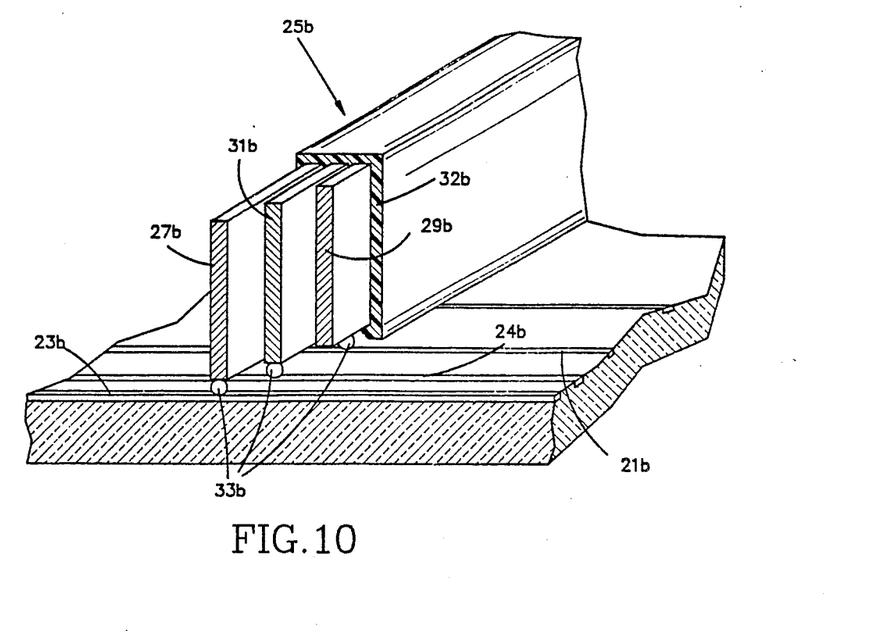
FIG. 10 is a perspective view partially in section showing yet another embodiment of the invention utilizing a three part single bus in an edge mounted configuration.

It should also be understood that a 3 or 4 part single bus, or multiple busses, could be used if more than two voltage levels are desired. Two types of three part single busses are shown in FIGS. 9 and 10. In FIG. 9 a bus 25a is shown comprised of a pair of voltage sections 27a and 29a and a ground section 31a all encapsulated in a dielectric material 32a. The voltage section 27a and 29a and ground section 31a are preferably formed of invar clad copper and are matched to the coefficient of thermal expansion of the wafer in the same manner as previously described with respect to matching the thermal expansion of the wafer to the substrate. The bus is face connected to voltage lines 21a and 23a and ground lines 24a by means of solder connection 33a. In this case two different voltage levels in addition to ground can be achieved.

FIG. 10 is similar to FIG. 9, except that it is an edge connection configuration in which a bus 25b is comprised of a pair of voltage lines 27b and 29b and a ground section 31b, all encapsulated in a dielectric material 32b. Again the voltage lines 27b and 29b and ground section 31b are formed of Invar clad copper with their thermal coefficients of expansion matched to the wafer as previously described. In this case the bus is edge connected to voltage lines 21b and 23b and ground line 24b by solder connection 33b, but in this case it is an edge configured connection.

Figure 1:
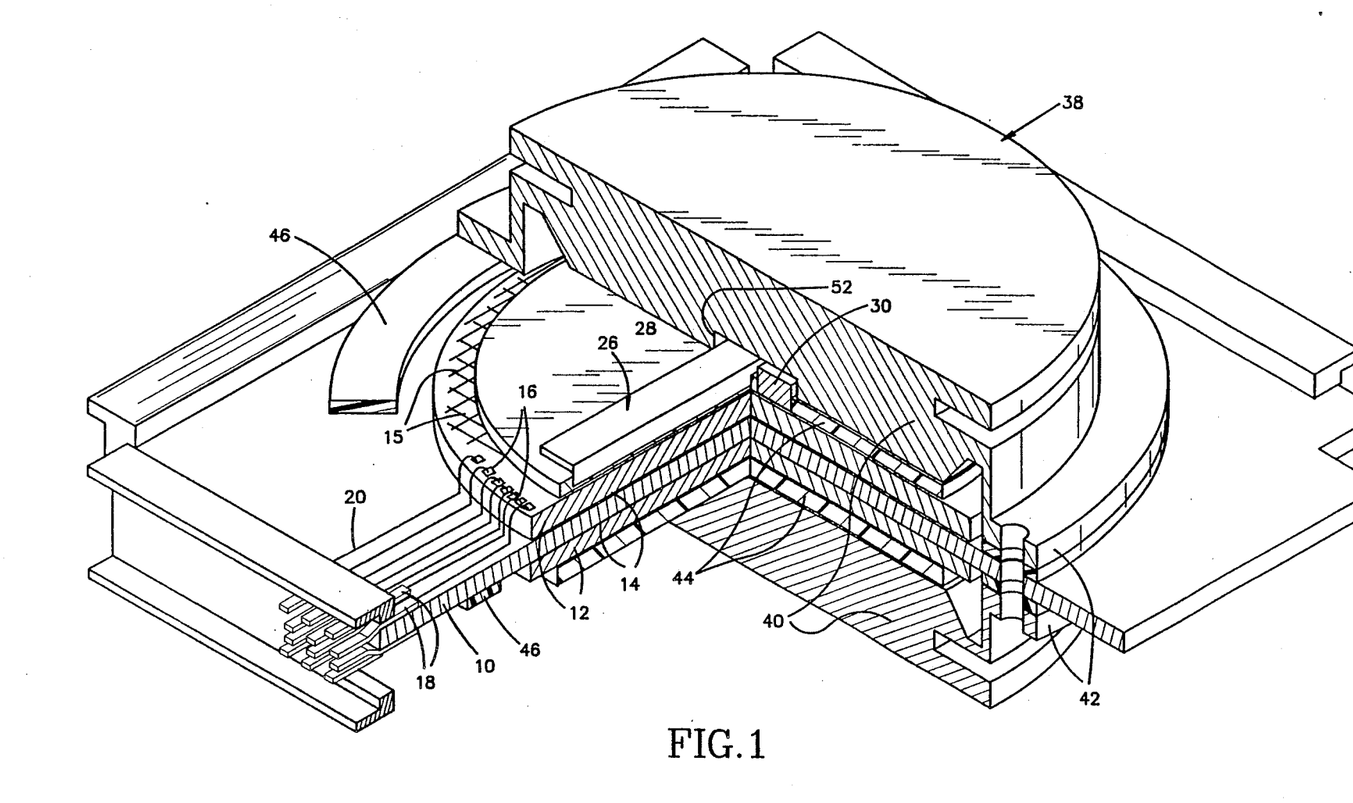
FIG. 1 is a perspective view partially in section of one embodiment of full wafer package according to this invention.
Figure 5:
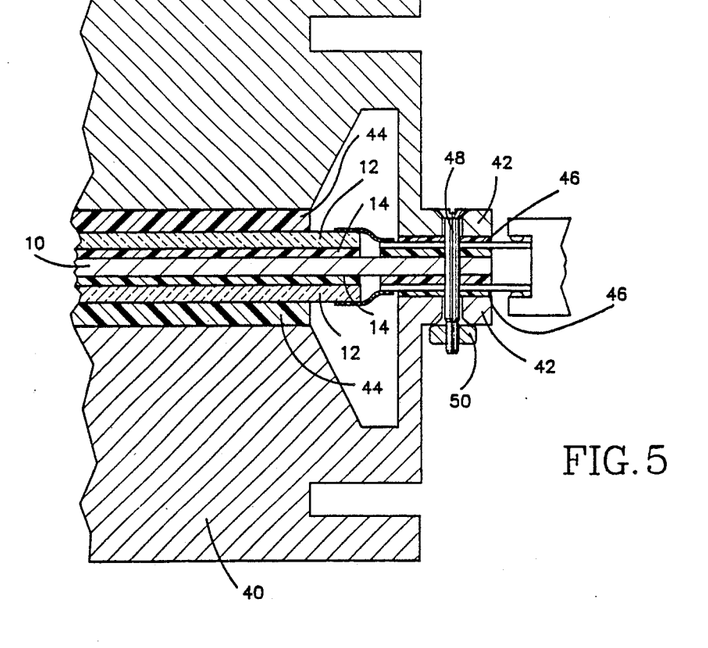
FIG. 5 is a sectional view of a portion of the edge of the device of FIG. 1 on an enlarged scale.
Figure 6:
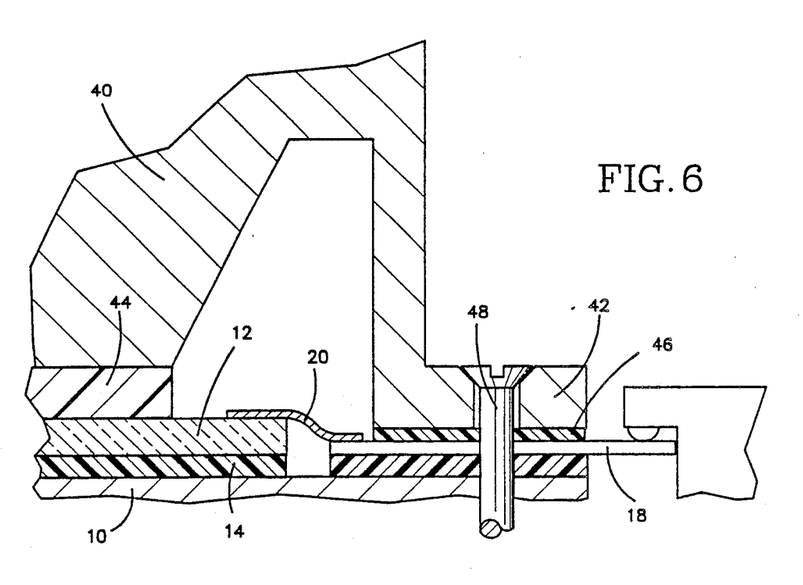
FIG. 6 is a more detailed section view of a portion of the edge of the device as shown in FIG. 5.

As can be seen in FIGS. 1 and 5, a heat sink cover member 38 is provided comprised of a pair of identical mating sections 40 enclosing the mounted wafers. Each section 40 has flanges 42 around the outer edge thereof. A disk shaped sheet of elastomeric thermally conducting solid compliable material 44 is disposed between each wafer and its respective section 40 of the heat sink cover to provide a thermal conduction path. One such material is a mixture of (by weight) about 100 parts silicon gum, about 500 parts zirconium silicate, and about 6 parts of a wetting agent sold by General Electric under the trademark VISCASEL 600M. This provides the desired properties of good thermal conductivity and thermal stability, and deformation resistance. A ring of elastomeric sealing material 46 is provided around each of the flanges of the covers between the flange and substrate 10, and circumferentially spaced bolts and nuts 48 and 50 resiliantly secure the cover sections 40 together and to the substrate. Preferably each cover section 40 has a slot 52 in which the bus 26 is disposed. (Of course, if there is more than one bus, a slot for each will be provided.)

Figure 2:
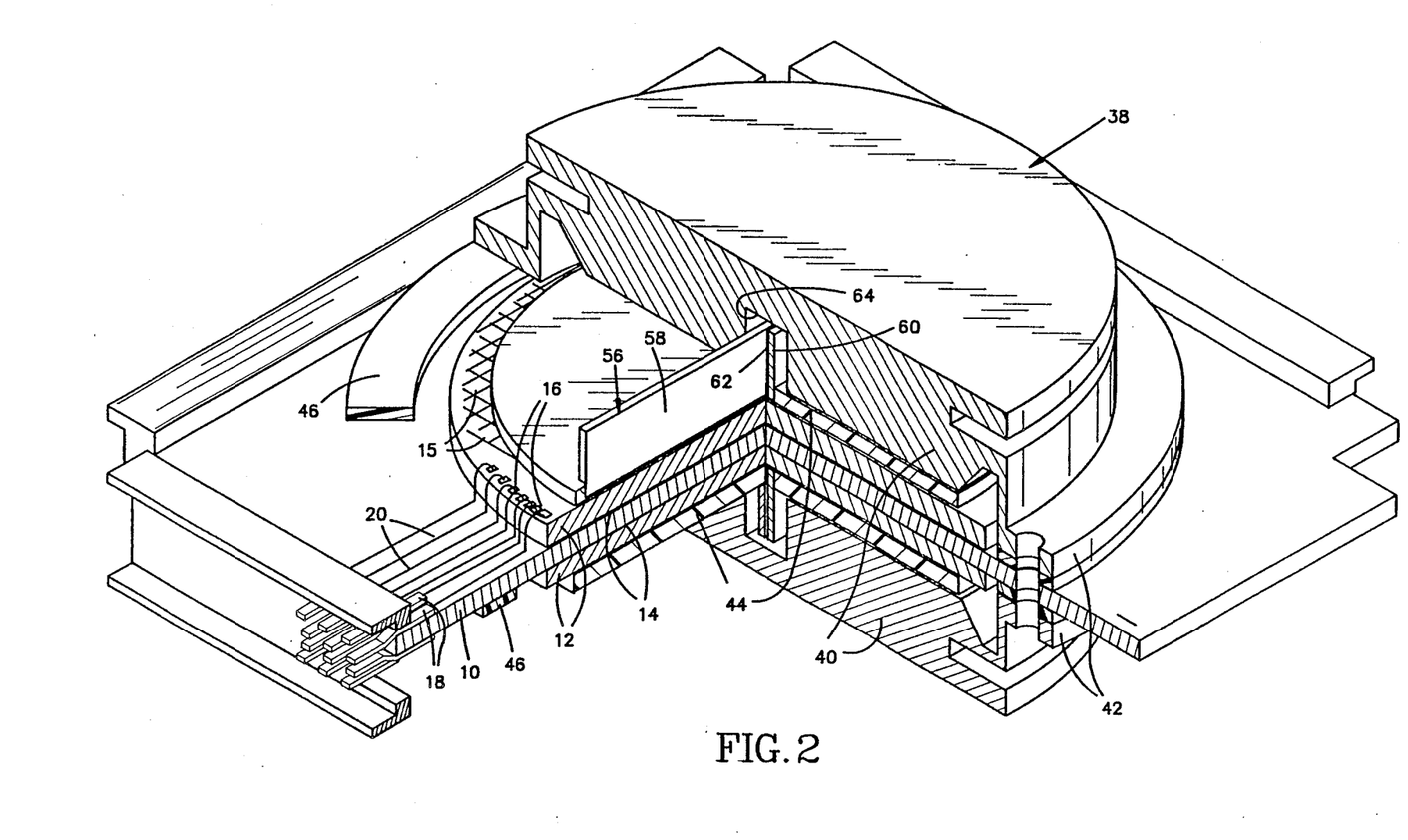
FIG. 2 is a perspective view partially in section of another embodiment of a full wafer package.
Figure 3:
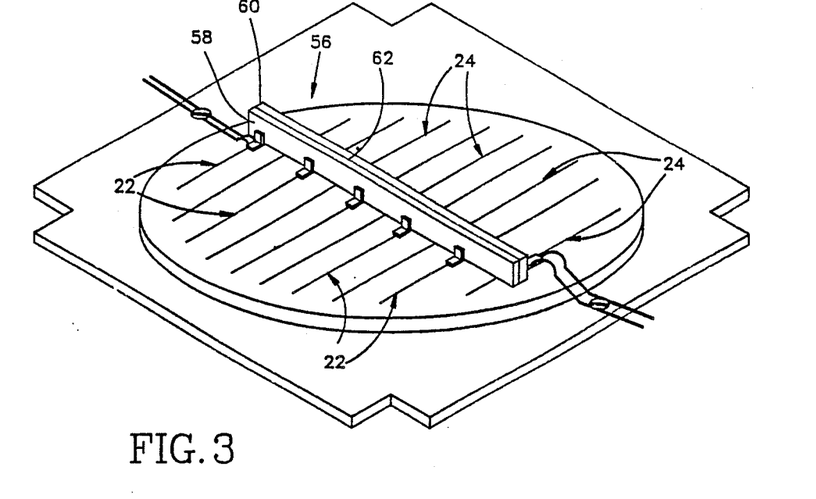
FIG. 3 is a perspective view, somewhat diagrammatic of the wafer and power supply of the embodiment of FIG. 2.

FIGS. 2 and 3 show a somewhat modified form of the bus structure of the invention. In this embodiment, a bus 56 is formed of voltage section 58 and ground section 60 joined in face-to-face relationship by dielectric adhesive 62. This bus structure is configured to be maintained with its edge contacting the wafer 12 as shown in FIG. 3 rather than its face as previously described. A slot 64 in each of the cover structures 40 is provided in which the bus is disposed.

Figure 7:
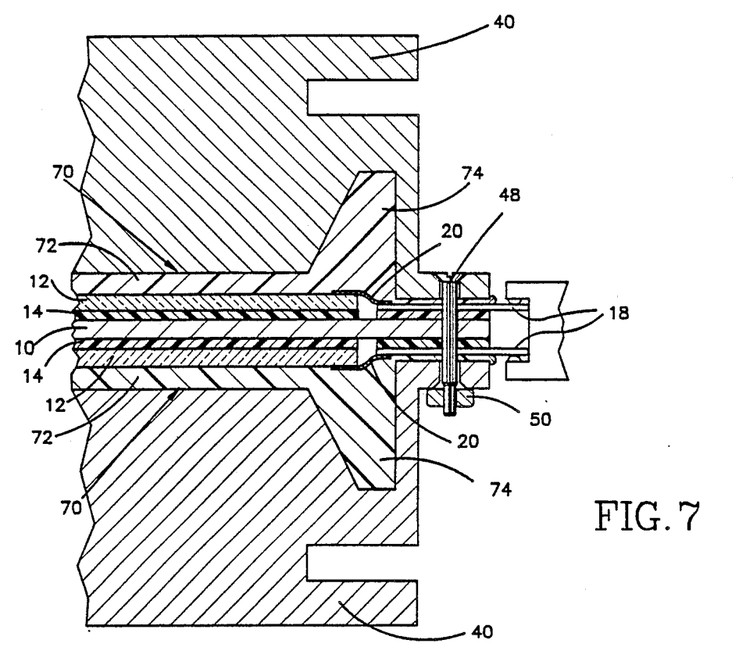
FIGS. 7 and 8 are sectional detail views similar to FIGS. 5 and 6 of a modified form of the invention.
Figure 8:
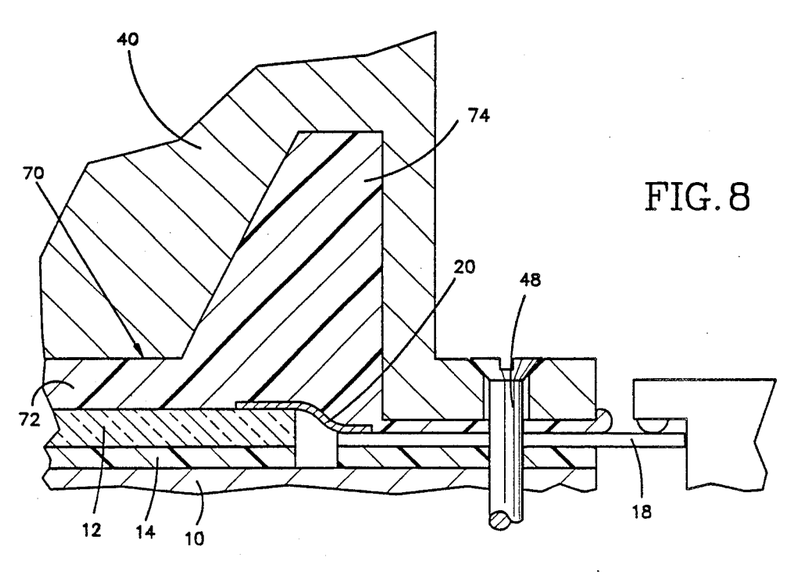

A modification of the invention is shown in FIGS. 7 and 8. In the previously described embodiments, there was empty space between the edge of the wafer and the cover and the cover and periphery of the substrate. However, in this embodiment, an elastomeric solid conformable dielectric thermally conducting material 70 is provided, which is cut or otherwise formed to substantially conform to the entire space between the wafer 12, including the pads 16 as well as the space around the wafer, between the substrate and the cover member 38. This can be the same type of thermally conducting material as previously described. The material 70 as shown has a central essentially uniformly thick center section 72 overlaying the wafer and a shaped outer portion 74 disposed in and around the location of the electrical signal connections to the pads 16 and 18. With this arrangement, if an area of the wafer or substrate is determined to have some electrical connections that are not completely tight, increasing the bolt torque slightly in that region will tend to improve the connection by squeezing the contacting surfaces of the wire leads and pads tightly together thus compensating for any faulty welds. Hence the need for a solid (as opposed to liquid) thermal conducting dielectric material is required in order to focus the torque pressure in the vicinity of increased torque onto the pad and wire lead connection since defective connections generate extra heat. Such defective connections can be detected by a temperature detector, located in proximity to the connections such as described in IBM Technical Disclosure Bulletin Vol. 16, No. 2 July 1973.

What is claimed is:

1. An integrated circuit package comprising
    a substrate adapted to support a semiconductor wafer on a least one side thereof;
    a semiconductor wafer mounted on at least one side of said substrate;
    each semiconductor wafer having a plurality of integrated circuit devices formed thereon and a plurality of electrically conducting lines extending in parallel relationship thereon, said lines being divided into at least a first group constituting a first voltage level, and a second group constituting a second voltage level, said lines being electrically connected to power the integrated circuit devices on said wafer;
    first and second electrically conducting strips extending across each wafer transverse to said electrically conducting lines,
    connection means connecting said first and second strips to said first and second groups of conducting lines respectively;
    means to connect said first and second strips to separate voltage levels,
    whereby said strips supply operative voltage levels across the surface of the wafer; and
    means to provide signals to and receive signals from said integrated circuit devices.

2. The invention as defined in claim 1 wherein said first and second electrically conducting strips comprise a bus member wherein said first and second conducting strips are laminated together and separated by a dielectric material.

3. The invention as defined in claim 2, wherein the bus is mounted to said wafer along one edge of said bus.

4. The invention as defined in claim 2, wherein the bus is mounted to said wafer along one face of said bus.

5. The invention as defined in claim 2 wherein there are a plurality of said bus members extending across said wafer.

6. The invention as defined in claim 1, wherein the strips are encapsulated in a dielectric material.

7. The invention as defined in claim 6, wherein there are two strips connected to two different voltage levels and a third strip connected to the wafer and a ground level.

8. An integrated circuit package comprising,
    a substrate adapted to support a semiconductor wafer on at least one side thereof;
    a semiconductor wafer mounted on at least one side of said substrate,
    each semiconductor wafer having a plurality of connection pads arranged around the periphery thereof,
    a plurality of integrated circuit devices found on said wafer and a plurality of electrical connectors disposed on said substrate arranged around aid wafer and corresponding to the connection pads on said wafer, electrical conducting leads connecting the connection pads on said wafer to said connectors on said substrate individually, a cover enclosing said wafer, a conformable solid thermally conducting the dielectric material interposed between said cover member and said leads substantially filling the space between the cover and the wafer and the cover and the connectors on the substrate and in contacting relationship with the wafer and the substrate and cover, and adjustable interconnecting means disposed around and in engagement with said cover and the periphery of said substrate clamping said cover to said wafer and said substrate, said interconnecting means having means to vary the mechanical force applied around the periphery of the substrate and the associated wafers whereby to correct defective electrical connection of said leads by applying increased pressure to the connections of the leads.

9. The invention as defined in claim 8, wherein temperature sensing means are disposed in proximity to at least some of said connections.

10. An integrated circuit package comprising a substrate, a semiconductor wafer mounted on said substrate and having semiconductor devices formed on the surface thereof, said wafer having an average temperature on the surface thereof during operation of a value T1, and said substrate having an average temperature of the value T2 on the face thereof during operation of the waver, and wherein T2 is lower than T1 said package having an ambient temperature T3 which is less than both T1 and T2 and wherein the coefficient of thermal expansion of said substrate is substantially equal to the coefficient of thermal expansion of said semiconductor wafer times T1-T3/T2-T3.

11. The invention as defined in claim 10, wherein the substrate is copper clad Invar.

12. The invention as defined in claim 10, wherein the wafer is silicon.

13. An integrated circuit package comprising, a substrate adapted to support a semiconductor wafer on a least one side thereof;

a semiconductor wafer mounted on at least one side of said substrate;

a plurality of semiconductor devices formed on the exposed surfaces of each wafer;

each semiconductor wafer having a plurality of connection pads arranged around the periphery thereof to provide signals to and received signals from said devices, a plurality of electrical connectors disposed on said substrate arranged around said wafer and corresponding to the connection pads on said wafer, electrical conducting leads connecting the connection pads on said wafer to said connectors on said substrate individually, a cover enclosing said wafer, a conformable solid thermally conducting material interposed between said cover and said leads substantially filling the space between the cover member and the wafer and the cover and the connectors on the substrate and in contacting relationship the wafer and the substrate and cover, adjustable interconnecting means disposed around and in engagement with said cover and the periphery of said substrate clamping said cover to said wafer and said substrate, said interconnecting means having means to vary the mechanical force applied around the periphery of the substrate and the associated wafers whereby to correct defective electrical connection of said leads by applying increased pressure to the connections of the leads;

and wherein each wafer has an average temperature on the surface thereof during operation of a value T1, and said substrate has an average temperature of T2 on the face thereof during operation of the wafer and wherein T2 is lower than T1, said package has an ambient temperature T3 which is less than both T1 and T2 and wherein the coefficient of thermal expansion of said substrate is substantially equal to the coefficient of thermal expansion of said semiconductor wafer times T1-T3/T2-T3;

and wherein each semiconductor wafer has a plurality of electrically conducting lines extending in parallel relationship thereon, said lines being divided into a least a first group constituting a first voltage level, and a second group constituting a second voltage level, said lines being electrically connected to power the devices on said wafer;

first and second electronically conducting strips extending across each wafer transverse to said electrically conducting lines, connection means connecting said first and second strips to said first and second groups of conducting lines respectively;

means to connect said first and second strips to separate voltage levels, whereby said strips supply operating voltage levels across the surface of the wafer.

* * * * *